United States Patent [19]

Morrison, Jr.

[11] 4,239,611
[45] * Dec. 16, 1980

[54] MAGNETRON SPUTTERING DEVICES

[75] Inventor: Charles F. Morrison, Jr., Boulder, Colo.

[73] Assignee: Vac-Tec Systems, Inc., Boulder, Colo.

[*] Notice: The portion of the term of this patent subsequent to Dec. 25, 1996, has been disclaimed.

[21] Appl. No.: 47,248

[22] Filed: Jun. 11, 1979

Related U.S. Application Data

[63] Continuation-in-part of Ser. No. 19,284, Mar. 9, 1979, which is a continuation-in-part of Ser. No. 946,370, Sep. 27, 1978, which is a continuation-in-part of Ser. No. 935,358, Aug. 21, 1978, Pat. No. 4,162,954.

[51] Int. Cl.$^3$ .......................................... C23C 15/00
[52] U.S. Cl. .................................. 204/298; 204/192 R
[58] Field of Search ................ 204/192 R, 192 C, 298

[56] References Cited

U.S. PATENT DOCUMENTS

| | | | |
|---|---|---|---|
| 3,853,740 | 12/1974 | Kunz | 204/298 |
| 3,864,239 | 2/1975 | Fletcher | 204/298 |
| 3,985,635 | 10/1976 | Adam et al. | 204/298 |
| 4,060,470 | 11/1977 | Clarke | 204/192 R |

Primary Examiner—Aaron Weisstuch
Attorney, Agent, or Firm—Gerald J. Ferguson, Jr.; Joseph J. Baker

[57] ABSTRACT

A magnetically enhanced sputtering device including first magnet means for establishing a magnetic field where the lines of force thereof extend over and may pass through the cathode sputtering surface at one predetermined area thereof. The first magnet means may be disposed on the side of the cathode opposite the sputtering surface where the flux therein may be substantially parallel to or inclined with respect to the sputtering surface. Second magnet means are preferably included in the path of the flux projected from the first magnet means so that the second magnet means not only contributes to the magnetic field formed over the sputtering surface, but it also blocks flux from extending below the first magnet means to thereby enhance the strength of the field formed over the first magnet means. Various embodiments are disclosed for effecting the foregoing.

Also disclosed is a sputtering device, which may use the foregoing magnetically enhanced sputtering techniques, where a plurality of different target materials may be sputtered in a predetermined sequence.

62 Claims, 26 Drawing Figures

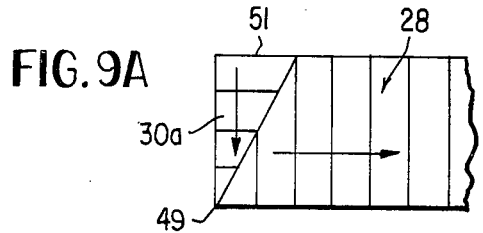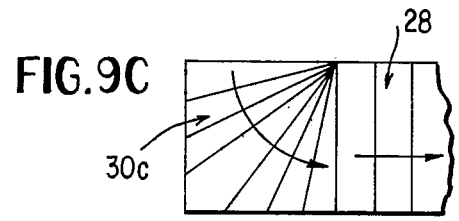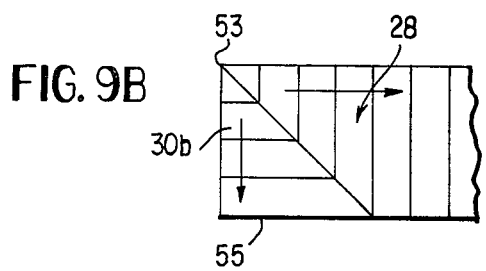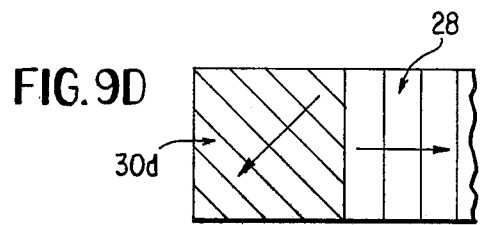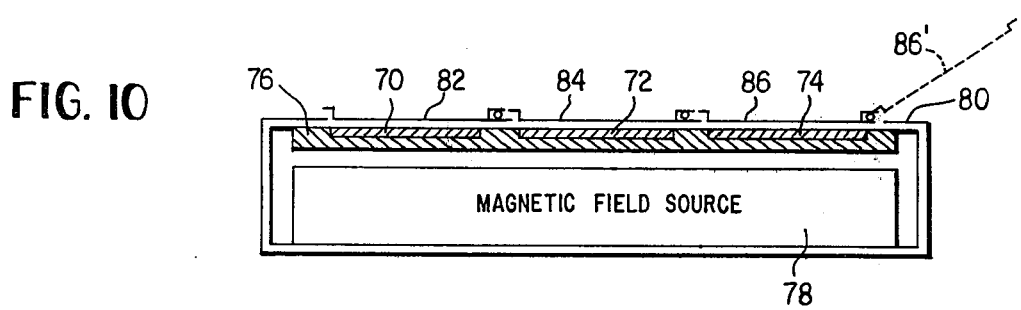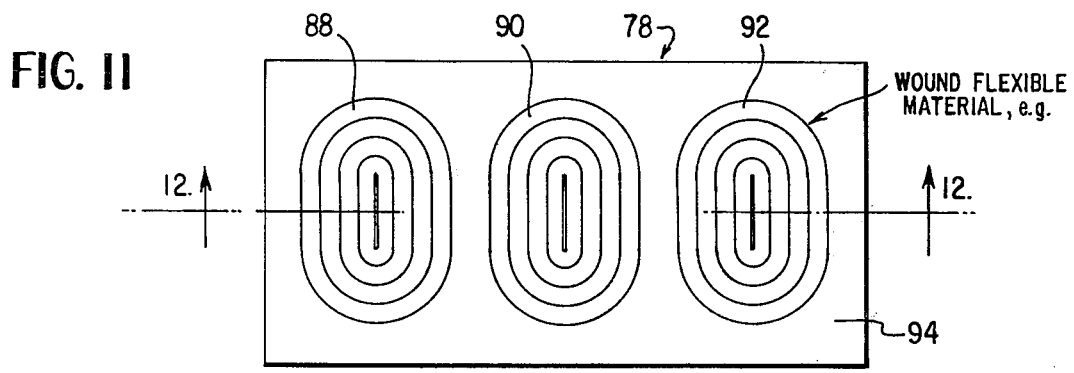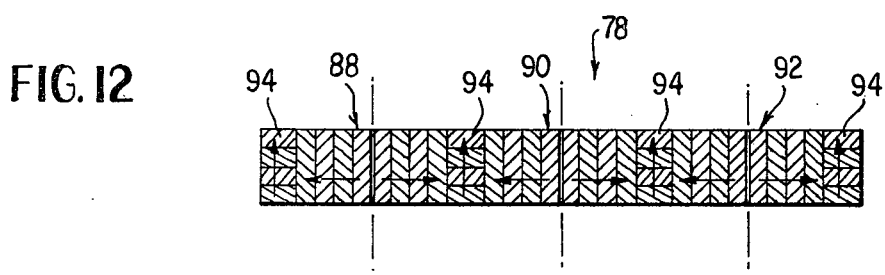

MAGNETRON SPUTTERING DEVICES

RELATED APPLICATIONS

This application is a continuation-in-part of co-pending U.S. Application Ser. No. 19,284, filed Mar. 9, 1979, which is a continuation-in-part of co-pending U.S. Application Ser. No. 946,370 filed Sept. 27, 1978, which in turn is a continuation-in-part of co-pending U.S. Application Ser. No. 935,358 filed Aug. 21, 1978, now U.S. Pat. No. 4,162,954. The present application is also related to co-pending U.S. Application Ser. No. 28,434 filed Apr. 9, 1979 and co-pending U.S. application Ser. No. 32,768 filed Apr. 24, 1979. All of the foregoing applications were filed by the present applicant, Charles F. Morrison, Jr. and are hereby incorporated herein by reference.

BACKGROUND AND OBJECTS OF THE INVENTION

This invention relates to sputtering devices and methods including magnetic enhancement of such devices.

FIGS. 1 and 2 are cross-sectional and perspective views respectively of a representative prior art planar magnetron sputtering device comprising inner magnet 10 and outer magnet 12 (both of which usually comprise a number of sections) where the magnets are shunted by an iron pole plate 14. Disposed above the magnetic structure is a cathode or target 16 (not shown in FIG. 2). The magnetic lines of force are as shown in FIG. 1 where they exit from and return through cathode 16, a similar technique being employed in U.S. Pat. No. 3,878,085 where the magnetic lines also enter and exit from the cathode surface.

An electric field is established between (a) a ring-like anode 17, which may be disposed around and spaced from cathode 16, (or the chamber wall may serve this function) and (b) the cathode or target whereby electrons are removed therefrom. Due to the configuration of the lines of magnetic force (the illustration of which is approximate), the removed electrons tend to concentrate in regions A where the lines of force are substantially parallel to the upper surface of target 16. There the electrons ionize gas particles which are then accelerated to the target to dislodge atoms of the target material. The dislodged target material then typically deposits as a coating film on an object to be coated. Assuming the object to be coated is in strip form or is mounted on a strip moving in the direction of the arrow shown in FIG. 2, the object will be uniformly coated, the strip being narrower in width than the length of the sputtering device.

Once the ionizing electrons are removed from the target, they travel long paths because they circulate in a closed loop defined between inner magnet 10 and outer magnet 12, the loop being above target 16. Hence, the electrons are effective in ionizing the gas particles. However, since most of the ionizing electrons are concentrated in regions A, the ionized gas particles will mainly erode cathode 16 in regions A'. Such uneven disintegration of the target is undesirable in that the target materials are most often extremely pure and accordingly, very expensive.

Another prior art arrangement is shown in cross-section in FIG. 3 where parallel magnets 18 and 20 are employed with pole pieces 22 and 24. However, this configuration is essentially the same as that of FIGS. 1 and 2 in its function and is subject to the same shortcomings.

At FIGS. 5 and 9 of aforementioned Pat. No. 4,162,954, there are disclosed magnetic field sources 28 which render the lines of force more parallel to the surface of target 16, these Figures corresponding to FIGS. 4 and 5 of the present application. The source 28 comprises a plurality of flexible magnetic tapes which may be concentrically arranged or stacked to form a flat coil as shown in FIG. 4. Each loop of the coil may comprise a strip of tape where the ends of each strip abut one another. Together the strips are substantially equivalent to a solid magnet where the directions of the flux in each strip magnet are represented by arrows in FIG. 4 and where the north and south poles of this "solid" magnet are as shown, it being understood that the polarities shown are illustrative and may be reversed, if desired. Rather than employing concentric or stacked strips as shown in FIG. 4, a single strip can be tightly wound to provide a spiral configuration which is also very effective. Typically the strips of flexible magnetic tape are oriented ferrite impregnated rubber strips ½ inch wide and 1/16 inch or ⅛ inch thick (such as PL-1.4H made by Minnesota Mining and Manufacturing Co.). Further, rather than tapes, ferrite block magnets (typically ¼×1 inch thick ferrite magnets made by Arnold Magnetics, Inc. or Crucible Iron and Steel Co.) may also be employed to construct a configuration corresponding to that of FIG. 4.

In spite of the improvements effected by the FIG. 4 embodiment, it still suffers from some uneven target utilization. Where the lines of flux enter the center line of the target at about 45° or more, there is no erosion of the target. The lack of erosion in the target center is of particular concern due to the great cost of most of the targets. Increasing the area significantly eroded before any point erodes all the way through the target is thus of great importance. Accordingly, the magnetic field source 28 of FIG. 5 may be employed whereby the magnets are tipped away from the perpendicular orientation shown in FIG. 4 to further enhance field parallelism. The angle of the magnets with respect to the perpendicular can fall within the 40°-60° range shown in FIG. 5 and preferably this angle should be 50°-55°. Special orientations of the magnets to change the pattern of erosion are readily implemented when the flexible magnets are used. Since the field is more parallel to the target surface in the embodiments of FIGS. 4 and 5, uniformity of target erosion is accordingly enhanced compared to the prior art embodiments of FIGS. 1–3. The prior art embodiments such as that of FIG. 1, however, are highly flux conservative in that no flux penetrates plate 14. That is, practically all of the flux is disposed above the magnetic field source. Hence, practically the entire flux of center magnet 10 can be used and about 50% of that from outer ring 12. In the embodiments of FIGS. 4 and 5, no particular emphasis is given to flux conservation because there is sufficient flux for most applications and to conserve flux without specific reason is not cost effective. However, in the embodiment of FIG. 5, where the magnets 28 are tipped toward the center of the structure to further narrow the loss of target material in the center, the flux levels projected upward tend to be somewhat marginal. That is, the criteria previously established for the erosion near the center of the target were that of a parallel field at approximately ⅜ inch of about 80 Gauss, and a resultant field angle of 45° or less. When the magnets are tipped to achieve the best resultant field angles, the parallel field level is difficult to achieve. The reason for this is as follows.

Referring to FIG. 6A, there is shown a single magnet 28' which may correspond to a single ferrite bar magnet or a plurality of ferrite strips of the type described before with respect to FIG. 4. Magnet 28' may also correspond to the right half of the FIG. 4 configuration. The direction of magnetic field projection is $\alpha = 0$. As $\alpha$ becomes larger, the projection power decreases. When two magnets 28' and 28" are brought toward each other in opposition as in FIG. 6B, the fields butt against each other. If the magnets are tipped partially downward as in FIG. 5, the influence of one field upon the other is to force a large proportion of the flux downward and away from target 16. In FIG. 6A, it can be seen that the proportions of flux returning to the south end of the magnet are the same above and below the magnet. When butted head on as in FIG. 6B, the flux is forced to exit from the top and bottoms of the magnets, but the proportion above and below remain essentially equal. If they are forced together only at the upper edge of their faces as in FIG. 5, the proportion of flux returning below will become significantly greater and thus unavailable for sputtering of target 16. However, as $\alpha$ approaches 55° from horizontal (note $\alpha$ also corresponds to the angle shown in FIG. 5), the upward projected part of the flux seems to come from a very narrow region and thus, erosion of the center of the target tends to be optimized assuming the parallel field strength is sufficient. That is, the region C in FIG. 6B becomes very small.

Assuming magnets 28' and 28" are assembled as stacks of flexible magnet strips, the flux levels become very large. As the magnet stacks are moved together, as in FIG. 6B, the flux pressure builds to extreme levels, and the flux is deflected out the top and bottom of the stacks at the region C. Each element of the magnet stacks 28' and 28" restricts the reverse flow of flux in the $\alpha = 0$ direction. As can be seen in FIG. 6B, the resultant flux flow is nearly perpendicular to $\alpha = 0$. Thus, the magnets of FIG. 6B are not oriented at the best angle with respect to each other to lessen this flux leakage out of the relatively wide region C. Angling the magnets downward about 55° as in FIG. 5 gives the best reduction of this leakage without overly exposing the backs of the magnets to destroy the required polarity for causing the flux. Thus, by this expedient the region C is reduced to a very narrow flux flow channel in the center of the structure; but most of the flux is lost out the bottom in the process.

Accordingly, it is an object of this invention to provide an improved magnetically enhanced sputtering device and method where the flux in a magnetic field source beneath the target may be angled with respect to the target and yet the strength of the parallel field over the central portion of the target is sufficient to effect sputtering thereof.

Even in the more simple structures, such as that of FIG. 4, without tipped magnets, there is a loss of nearly 50% of the flux out the bottom of the magnet. In these structures, targets can be placed on both sides of the magnet for simultaneous sputtering thereof. When an outer frame 30 is added to the structure of FIG. 4, as in FIG. 7 (which corresponds to FIG. 30 of aforementioned Application Ser. No. 19,284), the outer end of magnet 28 is effectively tipped upward while the center thereof is also effectively upwardly tipped by inner magnet 32.

As shown in FIG. 7, there is magnetic coupling at the bottom of the structure between magnets 28 and 30 and rejection at the top. This significantly lengthens the flux path from the bottom center of the magnet structure relative to that from the top center. This expedient thus reduces the magnitude of the bottom flux flow as does the magnet 32. As discussed in Application No. 19,284, magnet 32 thus enables the sputtering of thicker targets (greater than $\frac{1}{2}$ inch and typically 1 inch thick for heavier industrial coating applications such as glass, auto parts, plastic films, etc.) although at the expense of minimal sputtering of the target center due to the perpendicular orientation of the flux in magnet 32.

Accordingly, it is another object of this invention to provide an improved magnetically enhanced sputtering device and method wherein the percentage target utilization of thick targets is significantly improved.

Sputter cathodes such as those of FIGS. 1 and 4 have tended to be singly targeted. There are, however, cases in which multiple targets are desirable, provided in most situations that only one is operating at a given time.

Accordingly, it is a further object of this invention to provide an improved sputter cathode wherein a plurality of different target materials may be sputtered in a predetermined sequence.

Other objects and advantages of this invention will be apparent from a reading of the following specification and claims taken with the drawing.

BRIEF DESCRIPTION OF THE DRAWING

FIGs. 8A–8L are sectional views of illustrative magnetic field sources in accordance with the present invention.

FIGS. 9A–9D are sectional views of further illustrative magnetic field sources in accordance with the present invention.

FIG. 10 is a sectional view of a magnetically enhanced, multiple-targeted sputtering device in accordance with the invention.

FIG. 11 is a plan view of a magnetic field source for use with the sputtering device of FIG. 10.

FIG. 12 is a cross-sectional view taken along the line 12—12 of FIG. 11.

DETAILED DESCRIPTION OF PREFERRED EMBODIMENTS OF THE INVENTION

Figure 1:
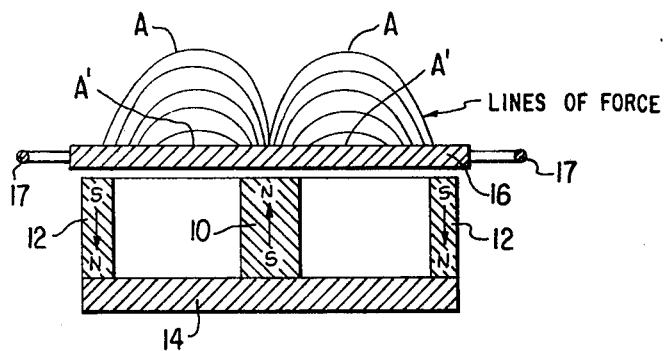
FIGS. 1 and 2 are cross-sectional and perspective views respectively of a prior art planar magnetron sputtering device.
Figure 2:
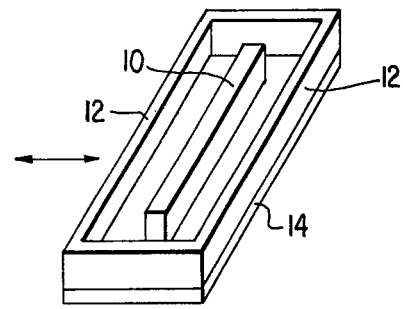

Reference should be made to the drawing where like reference numerals refer to like parts.

Figures 8A, 8B:
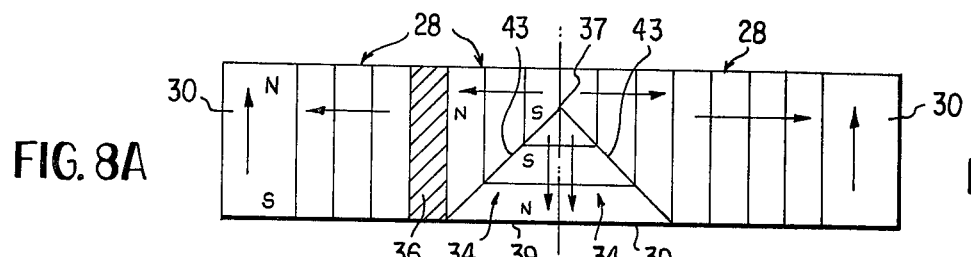

FIGS. 8A and 8B disclose two embodiments of the invention where FIG. 8A corresponds to the left half of one of the embodiments, the right half not being shown but being the mirror image of the illustrated left half.

The remaining embodiments of the invention are illustrated in a similar manner.

FIG. 8A includes, in addition to magnet stacks 28 and 30, a blocking magnet 34 and a spacer 36 of magnetically permeable material. The flux flow through the center bottom is almost totally eliminated by blocking magnet 34. This increases the flux on the upper or target side by 30-50%, and forces a steeper and taller field projection. Spacer 36 may be of high or low permeability to shape the projected field for best target utilization. As in all embodiments of the invention, the flux directions in the magnets of FIG. 8A may be reversed. Thus, in FIG. 8A, the flux directions in magnets 28, 30 and 34 may be reversed.

Figure 7:
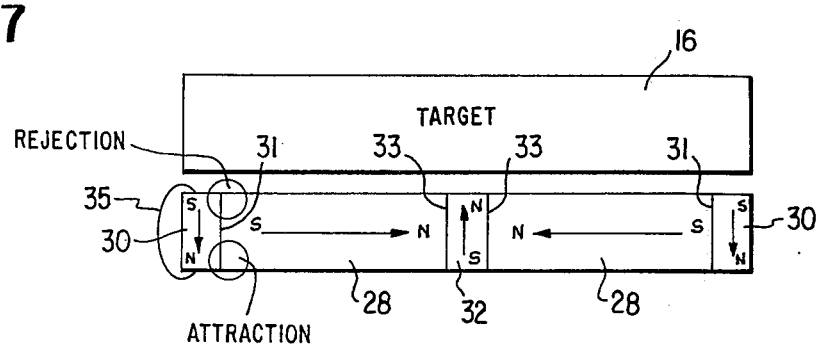
FIG. 7 is a sectional view which illustrates a magnetic field source disclosed in co-pending Application Ser. No. 19,284.

FIG. 8B shows a solid magnet structure used to generate the taller field projections needed for use with very thick targets such as the target illustrated in FIG. 7.

Figures 8C, 8D:
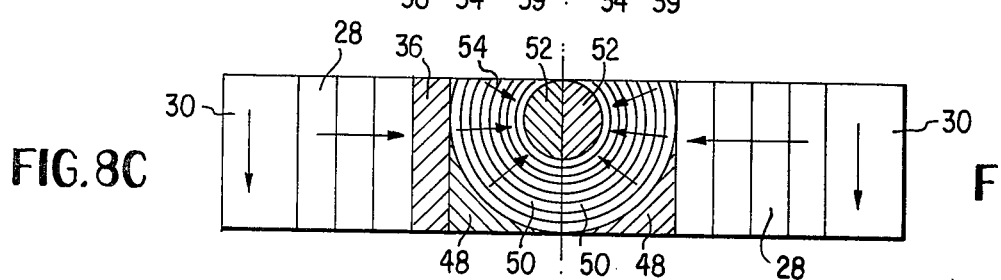
Figures 8E, 8F:
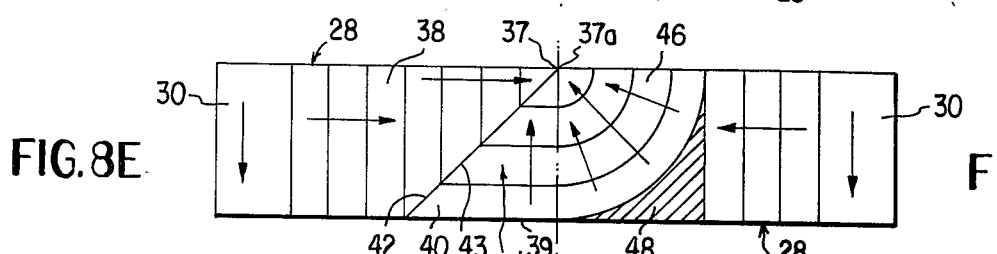

FIG. 8E is very similar, except that the diagonal junction is brought to the upper surface of the magnet structure. The angle of the junction is not particularly critical, and need not represent a break in the material—that is, for example, the strip 38 and strip 40 need not be separated at line 42; rather they may comprise one continuous strip. FIG. 8F illustrates continuous strips 46 of semi-circular section while FIG. 8C illustrates another circle based configuration 50. In FIG. 8F an insert 48 may be highly permeable for maximum field projection or of lower permeability to provide field shaping for thinner targets.

Figure 5:
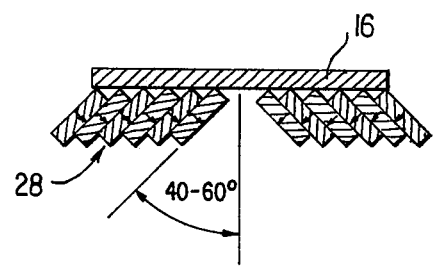
Figure 6A:
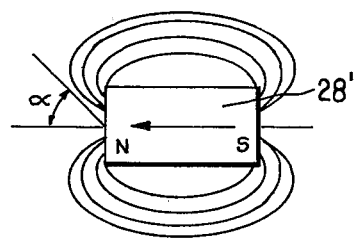
FIGS. 6A and 6B are sectional views which illustrate certain shortcomings of the embodiments of FIGS. 4 and 5.
Figure 6B:
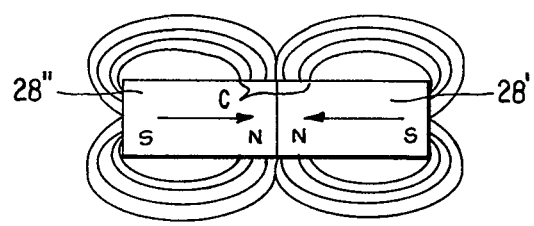

In the above embodiments, the tipped magnet arrangement of FIG. 5 has not been implemented. Nevertheless, it should be appreciated that because of the more powerful steeper field projection, the center void on very thick targets is narrowed significantly.

The remaining embodiments of FIG. 8 are directed to implementation of the tipped magnet concept. FIGS. 8C and 8D show a circle based, center magnet 50 disposed about a center mandrel 52 which may be of high or low permeability. The upper part of magnet 50 has some angle-in character as indicated at 54 helping to narrow the central flux path.

Figures 8G, 8H:
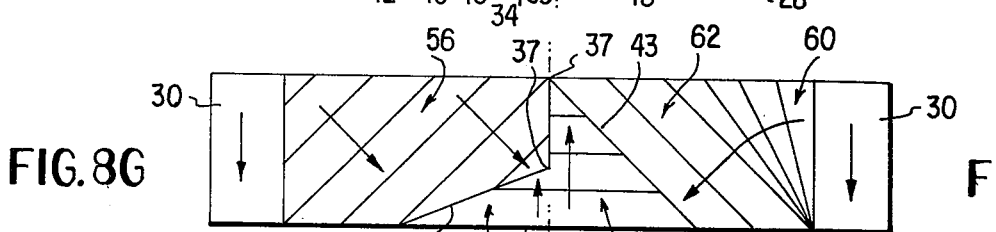

FIG. 8G illustrates tipped magnet 56 and blocking magnet 58. Of the various embodiments, FIG. 8G has the most narrow central flux path. However, the field projection to the left is such that the target should be considerably wider than the magnets 30 and 56 or else a tall 45° clamp ring should be used to secure the target.

Figures 8J, 8K:
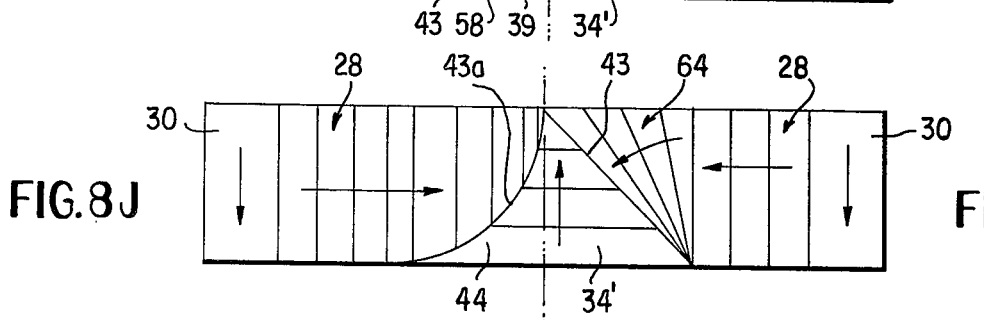

The embodiments of FIGS. 8H and 8K lessen field projection beyond outer frame 30 and illustrate preferred techniques for effecting the transition from the blocking magnets 34' to outer frame 30, this being effected in FIG. 8H by radially extending magnets 60 and tipped magnets 62 and in FIG. 8K by magnets 28 and radially extending magnets 64. Hence, in these embodiments not only is the central flux path quite narrow thereby permitting substantial erosion of the central portion of the target but also the target size may be commensurate with the magnetic field source size.

Figure 8L:
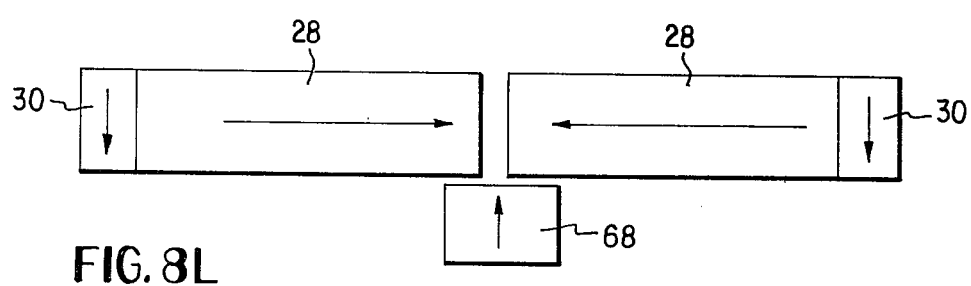

The embodiment of FIG. 8L also blocks the passage of flux below magnet 28, the blocking being effected by magnet 68. However, this embodiment is less preferred than those of FIGS. 7 and 8A-8K inasmuch as blocking magnet 68 does not contribute to the main flux above magnet 28. Thus, the blocking magnets of FIGS. 7 and 8A-8K not only block in varying degrees the passage of flux beneath magnet 28, they also contribute to the main flux above the magnet where, as stated hereinbefore, the strength of the parallel component of this flux should be at least a predetermined level to effect target sputtering.

In FIG. 7, the magnets 30 and 32 contact magnet 28 along surfaces 31 and 33, which are substantially parallel to the flux in magnets 30 and 32 such that lines of force as indicated at 35 pass outside magnet 30 and are thus not coupled to magnet 28 to thereby contribute to the main flux above magnet 28. Similar considerations apply to the magnetic coupling between magnets 28 and 32. Accordingly, although the magnets 30 and 32 do contribute some flux to the main flux above magnet 28 and are thus more efficient than the embodiment of FIG. 8L, they nevertheless are not as efficient as the centrally disposed, flux conserving, blocking magnets of the embodiments of FIGS. 8A-8K in effecting magnetic coupling to magnet 28.

Figure 4:
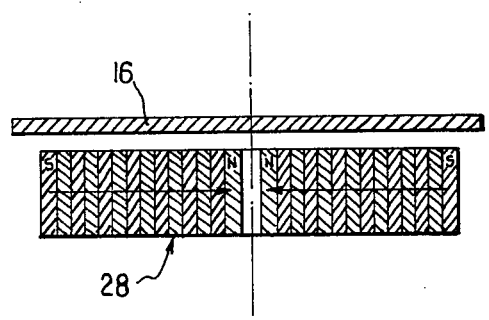
FIGS. 4 and 5 are cross-sectional views of illustrative magnetic field sources disclosed in Pat. No. 4,162,954.

It should also be noted that the triangular blocking magnets 34' of FIGS. 8H and 8K are not as narrow centered as is magnet 58 of FIG. 8G. Further, all of the embodiments so project the field that a wider portion of it is parallel to the target surface than is the case with the embodiments of FIGS. 4 and 5 at similar flux levels.

FIGS. 9A-9D illustrate some of the above concepts as applied to the outer frame 30 of FIG. 7. In FIG. 9A, triangular outer frame 30a provides better internal flux coupling than frame 30. Frame 30b of FIG. 9B requires a wider target. Frame 30c of FIG. 9C is very effective but expensive to build while frame 30d of FIG. 9D provides a well defined stopping line for the erosion of the target at the edge thereof.

In general, the magnets 30 and 32 of FIG. 7 have rectangular cross-sections and share common edges 31 and 33 with magnet 28, although the edges may be slightly separated from one another as in all embodiments of the invention. As discussed hereinbefore, this arrangement is effective in sputtering thicker targets although the central portion thereof tends not to be sputtered due to the perpendicularity of the flux in magnet 32 with respect to the target surface.

Although this shortcoming is acceptable in many industrial applications, its effects can be lessened by the embodiments of FIG. 8, as discussed above. Thus, in the embodiments of FIGS. 8A, B, E, G, H, J and K, magnet 34 has a substantially triangular cross-section and shares common edge 43 (or edge 43a of FIG. 8J) with magnet 28. The apex 37 and base 39 of the triangular cross-section are such that the apex 37 points towards the target 16. Hence, the blocking effect of magnet 32 of FIG. 7 is achieved without its strong perpendicular flux projection. Hence sputtering of the central portion of the thick target 16 is enhanced.

In the embodiments of FIGS. 8A, 8B and 8E, if there is no break 42 as discussed hereinbefore, then the inner magnet is basically U-shaped, the flux in the base of the U being perpendicularly directed with respect to target 16 while the flux in the legs of the U is substantially parallel to that in magnet 28.

In the embodiments of FIGS. 8C, D and F the cross-sections of magnets 46 and 50 comprise at least a portion of a circle where the cross-section of magnet 46 is semi-circular and the cross-section of magnet 50 is greater than a semicircle. In each of these embodiments, the flux extends toward the center of the circular cross-section.

In the embodiments of FIGS. 9A and 9B, magnets 30a and 30b also have substantially triangular cross-sections where the apex 49 and base 51 of triangle 30a are such that the apex points away from the target while in FIG. 9B, the apex 53 and base 55 are such that the apex points toward the target.

Thus, with respect to the embodiment of FIG. 7, the flux in magnets 30 and 32 is substantially perpendicular to the sputtering surface of target 16 as are the adjacent edges of magnets 28, 30 and 32. By varying the inclination of either the flux direction and/or the adjacent edge direction with respect to the sputtering surface, as in the illustrative embodiments of FIGS. 8 and 9, the advantages of the present invention in varying degrees may be obtained.

Reference should now be made to FIG. 10 which illustrates a magnetically enhanced multiple-targeted sputter cathode device including a plurality of targets 70–74 which typically comprise different materials, the targets being held by a target holder or cathode 76 conventionally maintained at cathode potential. A magnetic field source 78 may be disposed beneath the targets to provide magnetic enhancement of the sputtering thereof. A shield 80 extends over and is spaced from targets 70–74, the shield being typically maintained at anode or ground potential. The shield is placed sufficiently close to the targets so that a discharge will not occur. This technology has been used to restrict the area of discharge on a sputter cathode to the desired target area. The critical distance depends primarily on pressure and at sputter pressures in the micron range is about 3/16″. Thus, the shield prevents discharge or plasma generation occurring anywhere when power is applied under appropriate conditions.

In order to sputter anyone of the targets, gates 82–86 are provided in shield 80. Thus, target 74 may be sputtered when gate 86 is moved to its open position 86′. As long as only one gate 86 is open, only one discharge will occur, and cathode 76 operates under the electrical characteristics dictated by target 74 and its related conditions.

Any number of targets can be housed on the same cathode, but no discharge can occur unless a gate is opened. If more than one gate is opened, there is no simple mechanism for rate control among the discharges except possibly by regulating the exposed area. In general, however, each material has a different family of $E_0$ values, (that is, the extrapolated initiation voltage approximately at which current starts to flow through the sputtering device). The target having the lowest $E_0$ reaches high rate sputter conditions at voltages where the rates are very low for the higher $E_0$ targets. This is much like the problem of operating several cathodes simultaneously from a single power supply. This present invention is not directed to such problems. Rather, it is intended to provide a series of target materials to be sputtered in a selectable sequence from a single cathode structure.

The physical arrangements by which this concept can be practiced are many. Individual doors can be used, or a single door can be moved to position over the desired target. The cathode can be moved to bring the desired target to the door, etc. When magnetic enhancement is employed, there will need to be a magnet system for each target or active target position. For example, if the targets are all mounted on a chill plate, this can be moved to place the desired target between the magnetic field source and the open door in the shield. In smaller systems it may be simpler to use separate (or somewhat interrelated) magnetics for each as in FIG. 10 and move only the shield plate or door therein.

Figure 3:
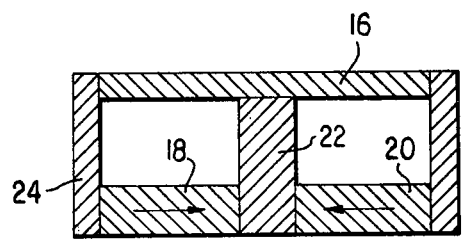
FIG. 3 is a cross-sectional view of another prior art device.

In FIGS. 11 and 12, an illustrative magnetic field source 78 includes a plurality of separate field sources 88–92, each of which preferably corresponds to one of the embodiments of FIGS. 4, 5, 8 and 9 of the present invention and which may correspond to the prior art embodiments of FIGS. 1 and 3. The sources 88–92 are disposed in an upright magnet frame 94.

The magnetic field sources of the present invention may be employed with planar cathodes which are circular or oblong. Oblong cathodes may be rectangular, elliptical or oval. Also, the planar cathode may be annular. Further, the planar cathode may include non-linear portions such as the concave portions shown in the cathodes of FIGS. 5 and 7 of aforementioned U.S. Pat. No. 3,878,085. In addition to planar cathodes, cylindrical, conical, closed belt, etc. cathodes may also be employed. Also, as the cathode is sputtered, there will be a tendency for it to become concave. Nevertheless, the cathode may still be considered planar, cylindrical or whatever its original shape was. Further, contoured surfaces may be imparted to the cathode so that it is thicker in areas of greatest expected erosion whereby the target will sputter relatively uniformly. Again, such a cathode is to be considered planar, cylindrical, etc. depending upon its general configuration prior to sputtering thereof.

The target material to be sputtered may or may not be the cathode of the device. If not, it may be clamped to the cathode by a clamp similar to clamp 32 of FIG. 10 of Pat. No. 4,162,954. Clamp 32 may also be employed to secure the cathode to the magnetic structure when the cathode and target are one and the same. When the target is distinct from the cathode, it may or may not be co-extensive therewith. If the target is smaller than the cathode, the magnetic lines of force may return to the magnetic structure through the cathode rather than the target. As long as the lines of force are substantially perpendicular to the cathode where they pass therethrough, sputtering of the cathode is minimized.

The desired strength of the magnetic field (typically a parallel field strength of at least 80 Gauss at least ⅜ inch above the sputtering surface) is preferably obtained with the ferrite magnets described hereinbefore where the rubber or plastic tapes impregnated with ferrite particles are advantageous. The presence of these particles, which are capable of producing a very strong magnetic field, in a low permeability binder such as rubber or plastic, is apparently advantageous in generating fields having the requisite strength, although it is to be understood that other ferrite magnets may be employed as may be appropriate ferromagnetic magnets such as alnico magnets.

With respect to magnets 28, 30, 32 and 34 (and the other magnets described hereinbefore), it is emphasized that these members are magnets as opposed to members made of non-magnetized, magnetically permeable material such as iron pole pieces frequently used in magnetic structures to direct lines of force. Such pole pieces and the like do not effect the requisite field shaping and/or generate the requisite field strength as is obtained by the present invention. Also, various combinations of magnets, slots, iron rings, etc. may be employed if so desired. Further, although permanent magnets are preferred for magnets 28, 30, 32, 34, etc., electromagnets may also be employed.

Regarding the anode referred to hereinbefore, it is usually so-called because sputtering systems are typically self-rectifying when an AC potential is applied.

Hence, although the term anode is employed in the following claims, it is to be understood that it may be any other equivalent electrode in the system. Further, the anode can be the container wall of the sputtering device. DC, low frequency AC (60 Hz, for example) or industrial radio frequencies, such as 13.56 MHz or 27.12 MHz, may be applied across the anode and cathode. To effect RF isolation, the anode is almost always the container wall when these high frequencies are employed although it is quite often employed as the anode when DC is employed.

As to the gas employed in the system, it may be either active or inert depending upon the type of sputtered layer desired. It should be further noted that the principles of the present invention can be applied to sputter etching.

What is claimed is:

1. A magnetically enhanced sputtering device comprising
    a cathode, at least a portion of which is provided with a sputtering surface;
    an anode spaced from said cathode for establishing an electric field therebetween; and
    first magnet means for establishing a magnetic field where at least some of the lines of force of the field extend over said sputtering surface, said first magnet means being disposed on the side of said cathode opposite said sputtering surface and extending along a line substantially parallel to at least a portion of said sputtering surface, and where the flux in said first magnet means extends between a first and second poles thereof; and
    second magnet means for causing a majority of the said lines of force of said magnetic field to extend over said sputtering surface where at least some of the flux in said second magnet means is inclined at an angle with respect to the flux in said first magnet means so that said second magnet means at least partially blocks the flux from said first magnet means from extending on the side thereof opposite said cathode.

2. A sputtering device as in claim 1 where said second magnet means is disposed in the path of the flux projected from said first magnet means so that said second magnet means contributes to the magnetic field extending over said sputtering surface.

3. A sputtering device as in claim 2 where said second magnet means is substantially aligned with respect to said first magnet means along said line parallel to the sputtering surface.

4. A sputtering device as in claim 2 where at least some of the flux in said second magnet means is perpendicular with respect to the flux in said first magnet means.

5. A sputtering device as in claims 2 or 3 where at least first and second portions of said first magnet means are disposed along said line parallel to said sputtering surface on opposite sides of a predetermined axis perpendicular to said sputtering surface and said second magnet means is disposed between said first and second portions of the first magnet means, said second magnet means having a predetermined cross-section in the plane including said predetermined axis and said line parallel to the sputtering surface.

6. A sputtering device as in claim 5 where at least some of the flux in said second magnet means is substantially directed along said predetermined axis.

7. A sputtering device as in claim 5 where said predetermined cross-section is substantially rectangular.

8. A sputtering device as in claim 7 where at least some of the flux in said second magnet means is substantially directed along said predetermined axis perpendicular to the sputtering surface.

9. A sputtering device as in claim 5 where said predetermined cross-section is substantially triangular.

10. A sputtering device as in claim 9 where at least some of the flux in said second magnet means is substantially directed along said predetermined axis perpendicular to the sputtering surface.

11. A sputtering device as in claim 5 where said predetermined cross-section is substantially U-shaped.

12. A sputtering device as in claim 11 where at least some of the flux in the base of the U-shaped second magnet means is substantially directed along said predetermined axis perpendicular to the sputtering surface.

13. A sputtering device as in claim 12 where at least some of the flux in the legs of the U-shaped second magnet means is substantially parallel to said line parallel to the sputtering surface.

14. A sputtering device as in claim 5 where said predetermined cross-section is at least a portion of a circle.

15. A sputtering device as in claim 14 where the flux in said second magnet means radially extends toward the center of the circle.

16. A sputtering device as in claim 15 where said predetermined cross-section is a semi-circle.

17. A sputtering device as in claim 15 where said predetermined cross-section is a portion of a circle greater than a semi-circle.

18. A sputtering device as in claim 5 where at least some of the flux in said first and second portions of the first magnet means is parallel to said line parallel to the sputtering surface.

19. A sputtering device as in claim 5 where at least some of the flux in said first and second portions of the first magnet means is inclined with respect to said line parallel to the sputtering surface.

20. A sputtering device as in claim 5 including a third magnet means substantially aligned with respect to said first and second magnet means, said third magnet means including first and second portions disposed adjacent the outer ends of said first and second portions of said first magnet means, said third magnet means having a predetermined cross-section in the plane including said predetermined axis and said line parallel to the sputtering surface.

21. A sputtering device as in claim 20 where said predetermined cross-section is substantially triangular.

22. A sputtering device as in claim 21 where the apex of said triangle points toward said cathode and where the flux in said third magnet means points toward said apex.

23. A sputtering device as in claim 21 where the apex of said triangle points away from said cathode and where the flux in said third magnet means points away from the apex.

24. A sputtering device as in claim 20 where the flux direction in said third magnet means curves between an orientation perpendicular to said line parallel to said sputtering surface to orientation parallel to said last-mentioned line to thereby enhance the magnetic coupling between said first and third magnet means.

25. A sputtering device as in claims 2 or 3 where at least a portion of one edge of said second magnet means is disposed adjacent at least a portion of one edge of said first magnet means.

26. A sputtering device as in claim 25 where said one edge portion of said second magnet means is in contact with said one edge portion of said first magnet means.

27. A sputtering device as in claim 25 including a magnetically permeable insert disposed between said first and second magnets to assist in the shaping of the magnetic field.

28. A sputtering device as in claim 25 where both said one edges of the first and second magnet means include at least portions which are substantially parallel to one another and are inclined with respect to said line parallel to the sputtering device.

29. A sputtering device as in claim 28 where both said edge portions are substantially linear.

30. A sputtering device as in claim 28 where the inclination of said one edge of said second magnet means is such that the second magnet means is more narrow in width at one end thereof than at the end opposite said one end.

31. A sputtering device as in claim 30 where the wider end of said second magnet means is closer to said cathode than the narrower end thereof.

32. A sputtering device as in claim 30 where the second magnet means is triangular in cross-section.

33. A sputtering device as in claim 32 where the apex of said triangular cross-section is disposed closer to said cathode than the base thereof.

34. A sputtering device as in claim 33 where said apex is colinearly disposed with respect to an edge of said first magnet means, said last-mentioned edge being adjacent to the side of said cathode opposite the sputtering surface.

35. A sputtering device as in claim 28 where the narrow end of said second magnet means is closer to said cathode than the wider end thereof.

36. A sputtering device as in claim 28 where both said one edge portions are substantially curvilinear.

37. A sputtering device as in claim 28 where at least some of the flux in said first magnet means is parallel to said line parallel to the sputtering surface.

38. A sputtering device as in claim 37 where the flux in said second magnet means is substantially perpendicular to said line parallel to the sputtering surface.

39. A sputtering device as in claim 28 where at least some of the flux in said first magnet means is inclined with respect to said line parallel to the sputtering surface.

40. A sputtering device as in claim 39 where the flux in said second magnet means is substantially perpendicular to said line parallel to the sputtering surface.

41. A sputtering device as in claim 25 where said one edge of the second magnet means is curvilinear.

42. A sputtering device as in claim 41 where said curvilinear edge is disposed around a central point and the flux within said second magnet means is radially directed toward said central point.

43. A sputtering device as in claim 41 where the flux in said second magnet means is substantially perpendicular to said line parallel to the sputtering surface.

44. A sputtering device as in claim 25 where second magnet means includes a central point and the flux within said second magnet means is radially directed toward said central point.

45. A sputtering device as in claim 44 where a portion of the flux in said second magnet means is directed toward said cathode and another portion is directed away therefrom.

46. A sputtering device as in claim 25 where at least one of said one edges of the first and second magnet means is substantially perpendicular to said line parallel to the sputtering surface.

47. A sputtering device as in claim 25 where both said one edges of the first and second magnet means are substantially perpendicular to said line parallel to the sputtering surface.

48. A sputtering device as in claim 46 where the other one of said one edges of the first and second magnet means includes at least a portion which is inclined with respect to said line parallel to the sputtering surface.

49. A sputtering device as in claim 48 where said other edge is curvilinear.

50. A sputtering device as in claims 1 or 2 where said first magnet means comprises permanent magnet means.

51. A sputtering device as in claim 50 where said second magnet means comprises permanent magnet means.

52. A sputtering device as in claim 51 where said first and second magnet means exhibit ferrimagnetism.

53. A sputtering device as in claim 52 where each said first and second magnet means comprise ferrimagnetic particles dispersed in a binder of low magnetic permeability.

54. A sputtering device as in claim 53 where said first and second magnet means each comprise a plurality of layers of magnetized tape where each strip is adjacent to and at least partially overlaps the layer adjacent to it.

55. A sputtering device as in claim 50 where said first magnet means has a substantially closed loop configuration.

56. A sputtering device as in claims 1 or 2 where said cathode is substantially flat.

57. A sputtering device as in claims 1 or 2 where said magnet causes the strength of the parallel component of said magnetic field at at least approximately $\frac{3}{8}$ inch from said sputtering surface to be at least approximately 80 Gauss.

58. A sputtering device as in claims 1 or 2 where the thickness of the sputtering surface layer is greater than $\frac{1}{4}$ inch.

59. A sputtering device as in claim 58 where said thickness is at least about 1 inch.

60. A sputtering device comprising
a cathode which is provided with a plurality of discrete sputtering surfaces where at least two of the sputtering surfaces are of different materials;
an anode spaced from said cathode for establishing an electric field therebetween;
shielding means disposed adjacent said sputtering surfaces for preventing sputtering at said sputtering surfaces, said shielding means including at least one gating means movable from a first position where the gating means covers at least one opening in the shielding means to a second position where the gating means uncovers the opening in the shielding means so that one of said sputtering surfaces disposed adjacent the uncovered opening may be sputtered; and
magnet means for establishing a magnetic field over said sputtering surfaces to magnetically enhance the sputtering thereof, said magnet means including (a) first magnet means for establishing a magnetic field where at least some of the lines of force of the field extend over said sputtering surface, said first magnet means being disposed on the side of said cathode opposite said sputtering surface and extending along a line substantially parallel to at least a portion of sputtering surface where the flux in said first magnet means extends between a first and second poles thereof; and (b) second magnet means for causing a majority of the said lines of force of said magnetic field to extend over said sputtering surface where at least some of the flux in said second magnet means is inclined at an angle with respect to the flux in said first magnet means so that said second magnet means at least partially blocks the flux from said first magnet means from extending on the side thereof opposite said cathode.

61. A sputtering device as in claim 60 where said second magnet means is disposed in the path of the flux projected from said first magnet means so that said second magnet means contributes to the magnetic field extending over said sputtering surface.

62. A sputtering device as in claim 60 where said shielding means has a plurality of said openings respectively disposed adjacent said plurality of sputtering surfaces and a plurality of said gating means for respectively covering and uncovering said plurality of openings so that predetermined ones of said sputtering surfaces may be sequentially sputtered.

* * * * *